(12) United States Patent
Watanabe et al.

(10) Patent No.: US 7,063,743 B2
(45) Date of Patent: Jun. 20, 2006

(54) APPARATUS AND METHOD FOR PULLING SINGLE CRYSTAL

(75) Inventors: Hideki Watanabe, Tokyo (JP); Isamu Miyamoto, Tokyo (JP); Toshiyuki Fujiwara, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 65 days.

(21) Appl. No.: 10/820,885

(22) Filed: Apr. 9, 2004

(65) Prior Publication Data

US 2004/0206301 A1    Oct. 21, 2004

(30) Foreign Application Priority Data

Apr. 11, 2003  (JP)  ............................. 2003-107655
Apr. 17, 2003  (JP)  ............................. 2003-112408

(51) Int. Cl.
*C30B 35/00*  (2006.01)

(52) U.S. Cl. .................. 117/200; 117/14; 117/201; 117/217; 117/218

(58) Field of Classification Search .................. 117/14, 117/15, 201, 217, 218
See application file for complete search history.

(56) References Cited

U.S. PATENT DOCUMENTS

| | | | |
|---|---|---|---|
| 5,885,344 A * | 3/1999 | Kim et al. ..................... | 117/13 |
| 5,997,635 A * | 12/1999 | Kubota et al. ................ | 117/14 |
| 6,117,402 A * | 9/2000 | Kotooka et al. ......... | 422/245.1 |
| 6,238,477 B1 * | 5/2001 | von Ammon et al. ........ | 117/13 |

* cited by examiner

*Primary Examiner*—Felisa Hiteshew
(74) *Attorney, Agent, or Firm*—Wenderoth, Lind & Ponack, L.L.P.

(57) ABSTRACT

The present invention teaches an apparatus for pulling a single crystal, whereby a radial temperature gradient of a seed crystal and/or a neck is reduced to a minimum so as to inhibit occurrence of thermal stress and prevent induction of dislocations, thereby resulting in an improvement in dislocation-free rate of single crystals to be pulled in cases where a single crystal is pulled with a seed crystal and/or a neck being heated using an auxiliary heating device. The apparatus comprises a crucible to be charged with a melt, a heater located around the crucible, and an auxiliary heating device including a heating section which can be located so as to surround a seed crystal in a position near and above the melt, a transfer mechanism for withdrawing the heating section from a passing area of a single crystal, and a covering section to cover a clearance between the heating section and the seed crystal extending from the heating section.

20 Claims, 11 Drawing Sheets

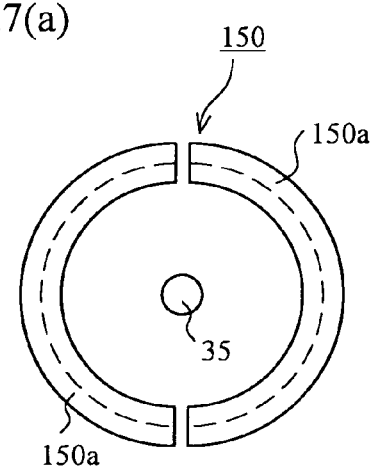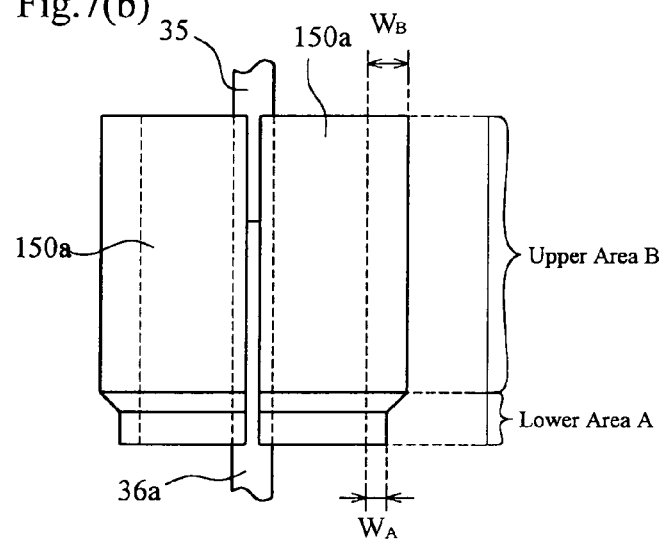

Fig.10(a) PRIOR ART
Fig.10(b) PRIOR ART
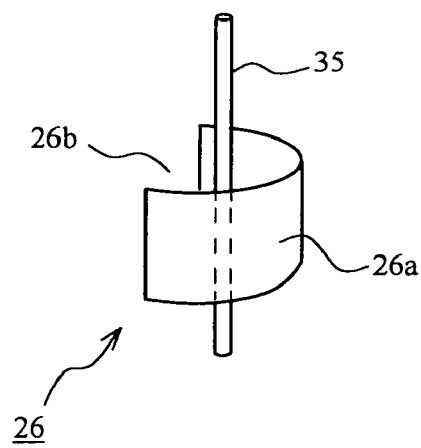
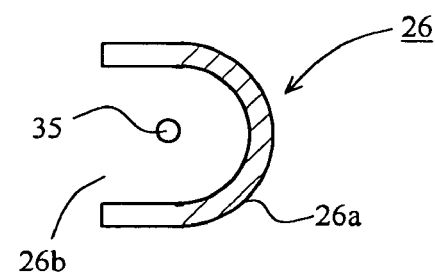

APPARATUS AND METHOD FOR PULLING SINGLE CRYSTAL

BACKGROUND OF THE INVENTION

1. Field of the Invention

The present invention relates to an apparatus and a method for pulling a single crystal and, more particularly, to an apparatus and a method for pulling a single crystal of silicon or the like by a pulling method such as the Czochralski method (hereinafter, referred to as the CZ method).

2. Description of the Relevant Art

At present, a majority of silicon single crystals used for manufacturing a substrate for forming a circuit component of a large scale integrated circuit (LSI) and the like have been pulled by the CZ method. As a method for excluding dislocations from a pulled single crystal, a method called the Dash necking method has been used in general, wherein a diameter of a crystal is narrowed down to about several millimeters so as to exclude dislocations. Recently, as a pulled single crystal has a larger diameter, weight of the single crystal has been increasing. Accordingly, a load imposed on a slender neck might exceed the tensile strength of silicon, so that a risk of a fall of the crystal during pulling a single crystal has increased.

In order to cope with the above risk, two methods have been developed: one method (See Japanese Kokai No. 1999-189488) wherein by preheating a seed crystal using a movable auxiliary heating device, induction of dislocations caused by a thermal shock of contact of the seed crystal with a melt is inhibited, so that a single crystal having no dislocation is pulled without forming a neck; and the other method (See Japanese Kokai No. 1999-189488) wherein by heating a neck using an auxiliary heating device during a dislocation-excluding activity according to the Dash necking method, a temperature distribution of the neck is controlled so as to reduce thermal stress affecting the neck, so that even with the neck having a larger diameter than usual, a single crystal having no dislocation can be pulled.

The applicant of the present invention previously proposed an apparatus for pulling a single crystal having an auxiliary heating device comprising a heating section which can be located so as to surround a seed crystal in a position near and above a melt charged in a crucible, and a transfer mechanism for withdrawing the heating section from a passing area of a single crystal (Japanese Kokai No. 2000-137986).

FIG. 9 is a sectional view schematically showing a conventional apparatus for pulling a single crystal having an auxiliary heating device. FIGS. 10(a) and 10(b) are a perspective view and a plan view, respectively, schematically showing a form of a heating section constituting the auxiliary heating device in the conventional apparatus for pulling a single crystal.

Reference numeral 21 in FIG. 9 represents a crucible, comprising a bottomed cylindrical quartz crucible 21a and a bottomed cylindrical graphite crucible 21b fitted on an outer side of the quartz crucible 21a. The crucible 21 is supported by a support shaft 28 which rotates in a direction shown by arrow A in FIG. 9 at a prescribed speed. A main heater 22 of a resistance heating type and a heat insulating mold 27 around the main heater 22 are concentrically arranged around the crucible 21. The crucible 21 is charged with a melt 23 of a material for forming a crystal which is melted by the main heater 22. On a central axis of the crucible 21, a pulling axis 24 made of a pulling rod or wire is suspended, and at a tip thereof, a seed crystal 35 is held by a holder 24a.

Reference numeral 25 in FIG. 9 represents a straightening vane. A main body 25a of the straightening vane 25 has a shape of a sidewall of an inverted truncated cone, is located so as to surround a pulled single crystal 36, and is arranged so that a lower end portion thereof can be positioned near and above a surface of the melt 23 charged in the crucible 21.

Reference numeral 26 in FIG. 9 represents an auxiliary heating device. A heating section 26a of the auxiliary heating device 26, as shown in FIGS. 10(a) and 10(b), surrounds half or more of a horizontal perimeter of the seed crystal 35 and has an opening 26b for withdrawing from the seed crystal 35, and is located so as to be able to surround the seed crystal 35 in a position near and above the melt 23. To the heating section 26a, an electrode 26c for supplying power to the heating section 26a and for descending or ascending the heating section 26a is connected. And a transfer mechanism (not shown), for withdrawing the heating section 26a from a passing area of a single crystal 36 during formation of a main body 36c after forming a neck 36a, is installed. The auxiliary heating device 26 comprises this heating section 26a, electrode 26c and transfer mechanism. Here, a heating area of the heating section 26a is shown with hatch lines in FIG. 10(b). These members, except the transfer mechanism, are assembled in a chamber 29 of a water cooled type wherein pressure can be controlled.

A method for pulling a single crystal 36 using the above apparatus for pulling a single crystal is described below by reference to FIGS. 11(a)–11(e). FIGS. 11(a)–11(e) are enlarged partial front views schematically showing a seed crystal and the vicinity thereof in part of steps in pulling a single crystal.

Although it is not shown in FIGS. 11(a)–11(e), the pressure in chamber 29 is reduced and an inert gas is introduced into the chamber 29 so as to provide an inert gas atmosphere under reduced pressure within the chamber 29. And then, material for forming a crystal is melted using the main heater 22 and is maintained for a period of time so as to sufficiently release gas contained in the melt 23.

While the pulling axis 24 is rotated on the same axis in a reverse direction of the support shaft 28 at a prescribed speed, the seed crystal 35 held by the holder 24a is caused to descend and is preheated (FIG. 11(a)). The seed crystal 35 is caused to descend so that a front portion 35a thereof is dipped into the melt 23 (FIG. 11(b)).

Then, while heating an interface between the seed crystal 35 and the melt 23 using the auxiliary heating device 26, the seed crystal 35 is caused to further descend to be immersed in the melt 23 (FIG. 11(c)).

The seed crystal 35 is pulled at a prescribed speed so as to form neck 36a, having almost the same diameter as the seed crystal 35, at the lower portion thereof. At this time, by heating an interface between the neck 36a and the melt 23 using the heating section 26a of the auxiliary heating device 26, thermal stress originating from a temperature distribution of the neck 36a is reduced, so that dislocations are excluded from the neck 36a (a dislocation-excluding step, FIG. 11(d)).

By actuating the transfer mechanism (not shown), the heating section 26a is withdrawn from the neck 36a, and by slowing a pulling speed of the pulling axis 24 (hereinafter, simply referred to as the pulling speed), the neck 36a is made to grow to have a prescribed diameter, leading to formation of a shoulder 36b (a shoulder formation step). By pulling the pulling axis 24 at a fixed rate, a main body 36c having a uniform diameter and a prescribed length is formed (a main body formation step, FIG. 11(e)).

Although it is not shown in FIGS. 11(a)–11(e), in order to prevent induction of high density dislocation to the single crystal 36 by a steep change in temperature at an end, the diameter thereof is gradually decreased and a temperature of the entire single crystal 36 is gradually lowered, leading to formation of an end-cone. Then, the single crystal 36 is separated from the melt 23. Cooling the single crystal 36 is completion of the pulling of the single crystal 36.

In the above conventional apparatus for pulling a single crystal, by heating the interface between the seed crystal 35 and the melt 23 using the heating section 26a of the auxiliary heating device 26, thermal shock from contact with the melt 23 is reduced, so that a number of induced dislocations in contact therewith can be decreased. And by heating the neck 36a, a temperature gradient in a radial direction of the neck 36a is made smaller. Therefore, thermal stress is decreased and a capability of excluding dislocations in the neck 36a is enhanced, so that a single crystal having no dislocation can be pulled.

However, the heating section 26a comprises a heater of a resistance heating type being U-shaped in a plan view with a heating area thereof set to be 50–70% of the horizontal perimeter of the seed crystal 35, so that most of heat from the heating section 26a is upwardly radiated from a clearance between the heating section 26 and the seed crystal 35. Since a total amount of heating applied to the seed crystal 35 or the neck 36a is reduced, it is difficult to make a radial temperature gradient thereof smaller. As a result, there is a possibility that thermal stress is caused, leading to induction of dislocations.

And a side surface of the crystal is heated using the heating section 26a during growing the neck 36a, which is contrary to a physical phenomenon that a crystal is solidified by removing heat, being a fundamental principle of crystal growth. Therefore, this process is formed on a delicate heat balance. While growth of the neck 36a requires skill of an operator, the pulling speed during the growth thereof cannot be made so fast as a general pulling speed (2–4 mm/min) in a conventional necking step. As a result, the neck 36a cannot be grown at a higher speed than a speed at which induced dislocations in the neck 36a propagate, so that it is hard to exclude dislocations from the neck 36a.

SUMMARY OF THE INVENTION

The present invention was accomplished in order to solve the above problem, and it is an object of the present invention to provide an apparatus for pulling a single crystal whereby a radial temperature gradient of a seed crystal and/or a neck is reduced to a minimum so as to inhibit occurrence of thermal stress and prevent induction of dislocations, thereby resulting in an improved dislocation-free rate of single crystals to be pulled in cases where the seed crystal and/or the neck is heated using an auxiliary heating device to pull the single crystals.

It is another object of the present invention to provide an apparatus and a method for pulling a single crystal, which enables a higher formation speed of a neck even when a single crystal is pulled with a seed crystal and/or the neck being heated using an auxiliary heating device.

In order to achieve the above objects, an apparatus for pulling a single crystal according to a first aspect of the present invention is characterized by comprising a crucible which is charged with a melt, a heater located around the crucible, an auxiliary heating device including a heating section which can be located so as to surround a seed crystal in a position near and above the melt, a transfer mechanism for withdrawing the heating section from a passing area of a single crystal and associated parts, and a covering section to cover a clearance between the heating section and the seed crystal extending from the heating section.

Using the apparatus for pulling a single crystal according to the first aspect of the present invention, heat radiation to above the heating section is inhibited by the covering section, so that a radial temperature distribution of the seed crystal can be made smaller. As a result, a shape of a growth interface at a lower end of the seed crystal can be made downward convex, thermal stress is reduced, induction of dislocations can be prevented, and a dislocation-free rate of single crystals to be pulled can be improved. Even when a neck is formed at the seed crystal, the same effects as the above can be obtained. A capability of excluding dislocations in the neck can be enhanced, so that a single crystal can be pulled without propagating dislocations.

An apparatus for pulling a single crystal according to a second aspect of the present invention is characterized by the covering section functioning as a heat insulating section or a heating section in the apparatus for pulling a single crystal according to the first aspect of the present invention.

Using the apparatus for pulling a single crystal according to the second aspect of the present invention, when the covering section functions as the heat insulating section, heat radiation outward from the covering section can be inhibited, so that it is possible to improve a heat insulating characteristic between the heating section and the seed crystal. And when the covering section functions as the heating section, it is possible to make a radial heat distribution between the heating section and the seed crystal more uniform.

An apparatus for pulling a single crystal according to a third aspect of the present invention is characterized by the covering section having a first opening for allowing the seed crystal to pass through, with a diameter of the first opening being set within a range of 1.25–3.0 times a diameter of the seed crystal, in the apparatus for pulling a single crystal according to the first or second aspect of the present invention.

Using the apparatus for pulling a single crystal according to the third aspect of the present invention, since the diameter of the first opening is set within the range of 1.25–3.0 times that of the seed crystal, it is possible to inhibit heat radiation upward from a clearance between the first opening and the seed crystal, so that a radial temperature gradient of the seed crystal covered by the heating section and the covering section, or that of a neck formed at the seed crystal, can be made smaller. Therefore, a shape of a growth interface at the lower end of the seed crystal or the neck can be made downward convex, so that propagation of dislocations can be inhibited and the dislocations can be efficiently excluded.

Here, when the diameter of the first opening is larger than 3.0 times that of the seed crystal, heat radiation upward from the clearance between the first opening and the seed crystal increases. Therefore, the radial temperature gradient of the seed crystal or the neck becomes large, so that it becomes difficult to make the shape of the growth interface downward convex. As a result, undesirably, propagation of dislocations cannot be sufficiently inhibited and dislocations are easily induced.

The diameter of the first opening being smaller than 1.25 times that of the seed crystal is not preferable because there is a risk of the covering section and the seed crystal coming into contact with each other at the opening.

An apparatus for pulling a single crystal according to a fourth aspect of the present invention is characterized by both the heating section and the covering section having a second opening for withdrawing from a passing area of the seed crystal, with a width of the second opening being set within a range of 1.25–3.0 times the diameter of the seed crystal, in the apparatus for pulling a single crystal according to any of the first through third aspects of the present invention.

Using the apparatus for pulling a single crystal according to the fourth aspect of the present invention, since the width of the second opening is set within the range of 1.25–3.0 times the diameter of the seed crystal, it is possible to inhibit heat radiation sideward from the second opening, so that a horizontal (radial) temperature gradient of the seed crystal or a neck formed at the seed crystal can be made smaller. Therefore, thermal stress at the seed crystal or the neck is reduced, so that induction of dislocations can be effectively prevented.

Here, when the width of the second opening is larger than 3.0 times the diameter of the seed crystal, heat radiation from the second opening increases. Therefore, since the radial temperature gradient of the seed crystal or the neck becomes large, a capability of excluding dislocations from the seed crystal and the neck becomes lower and it becomes difficult to exclude dislocations because of occurrence of thermal stress which induces new dislocations, undesirably.

The width of the second opening being smaller than 1.25 times the diameter of the seed crystal is not preferable because there is a risk of the opening and the seed crystal coming into contact with each other during withdrawal from the seed crystal.

A method for pulling a single crystal according to a first aspect of the present invention is characterized by a method for pulling a single crystal using the apparatus for pulling a single crystal according to any of the first through fourth aspects of the present invention, wherein a seed crystal having a diameter of 8–14 mm is used.

Using the method for pulling a single crystal according to the first aspect of the present invention, since the diameter of the seed crystal is at least 8 mm, it is possible to sufficiently hold a single crystal even if a heavy single crystal with a main body having a diameter of about 12 inches, weighing about 300 kg is pulled. And since the diameter of the seed crystal is not more than 14 mm, a front portion thereof can be sufficiently heated before contact with the melt, so that a radial temperature gradient can be made smaller and induction of dislocations caused by a thermal shock from contact with the melt can be prevented.

An apparatus for pulling a single crystal according to a fifth aspect of the present invention is characterized by comprising a crucible which is charged with a melt, a heater located around the crucible, an auxiliary heating device including a heating section which can be located so as to surround a seed crystal in a position near and above the melt, and a transfer mechanism for withdrawing the heating section from a passing area of a single crystal and associated parts, wherein the heating section is constructed of a vertically lower area and a vertically upper area having different heating strengths relative to each other, with the heating strength of the vertically lower area being made higher than the heating strength of the vertically upper area.

In the apparatus for pulling a single crystal according to the fifth aspect of the present invention, since the heating section has a construction wherein the vertically lower area and the vertically upper area thereof have different heating strengths relative to each other, and the heating strength of the vertically lower area is made higher than that of the vertically upper area, it is possible to shift a peak of a heating distribution by the heating section to a vertically lower level of the heating section. As a result, a vertical temperature gradient in the heating section can be made larger, so that formation speed of a neck can be made higher.

Here, the heating strength indicates a heating value per unit area. And a height ratio between the vertically upper area and the vertically lower area is set in a range of 24:1 to 7:3, preferably 9:1 to 8:2. For example, when a height of the heating section is 50 mm, the vertically lower area is set in the range of 2–15 mm high from a lower end of the heating section, more preferably 5–10 mm high from the lower end thereof. If the vertically lower area is set to be less than 5 mm high, a heating peak level can be greatly shifted downward, resulting in an enhanced effect of making a formation speed of the neck higher. However, since an amount of removed heat in the vertically upper area becomes larger, a heat balance between a solid-liquid interface and a region thereabove becomes bad, so that it becomes difficult to secure a temperature gradient required for excluding dislocations. On the other hand, if the vertically lower area is set to be more than 10 mm high, the vertical temperature gradient in the heating section becomes smaller, resulting in a lower formation speed of the neck.

An apparatus for pulling a single crystal according to a sixth aspect of the present invention is characterized by a ratio of the heating strength of the vertically upper area to the heating strength of the vertically lower area being set within a range of 1:2.0–5.0, in the apparatus for pulling a single crystal according to the fifth aspect of the present invention.

In the apparatus for pulling a single crystal according to the sixth aspect of the present invention, since the ratio of the heating strength of the vertically upper area to that of the vertically lower area is set within the range of 1:2.0–5.0, a heat balance between a solid-liquid interface and a region thereabove can be desirably maintained, and a vertical temperature gradient in the heating section required for excluding dislocations can be properly maintained. As a result, a formation speed of a neck can be made higher and dislocations can be surely excluded from the neck.

A method for pulling a single crystal according to a second aspect of the present invention is characterized by a method for pulling a single crystal using the apparatus for pulling a single crystal according to the fifth or sixth aspect of the present invention, wherein a heating power of the heating section is set within a range of 30–80% of a seed melt power when the seed crystal is dipped into the melt so as to form a neck.

In the method for pulling a single crystal according to the second aspect of the present invention, since the heating power of the heating section is set within the range of 30–80% of the seed melt power when the seed crystal is dipped into the melt so as to form a neck, a temperature gradient required for excluding dislocations from a solid-liquid interface can be appropriately maintained, and a heat balance between a temperature of the melt directly below the heating section and that of an outer region of the melt can be properly maintained. Therefore, thermal stress in the neck is reduced and development of dislocations within the neck is prevented, so that it is possible to reliably exclude dislocations from the crystal during growth of the neck. As a result, a single crystal to be grown at a lower end portion of the neck can be surely made dislocation-free.

BRIEF DESCRIPTION OF THE DRAWINGS

FIGS. 2(a)–2(c) are diagrams schematically showing a form of a heating section according to the first embodiment, wherein FIG. 2(a) is a plan view, FIG. 2(b) is a front view and FIG. 2(c) is a sectional view along C—C line of FIG. 2(a);

FIGS. 3(a)–3(c) are diagrams schematically showing a form of a heating section according to a second embodiment, wherein FIG. 3(a) is a plan view, FIG. 3(b) is a front view and FIG. 3(c) is a sectional view along C—C line of FIG. 3(a);

FIGS. 7(a) and 7(b) are a plan view and a front view, respectively, schematically showing a form of a heating section according to a fourth embodiment;

FIGS. 10(a) and 10(b) are diagrams schematically showing a form of a conventional heating section, wherein FIG. 10(a) is a perspective view and FIG. 10(b) is a plan view.

DETAILED DESCRIPTION OF THE PREFERRED EMBODIMENTS

Figure 9:
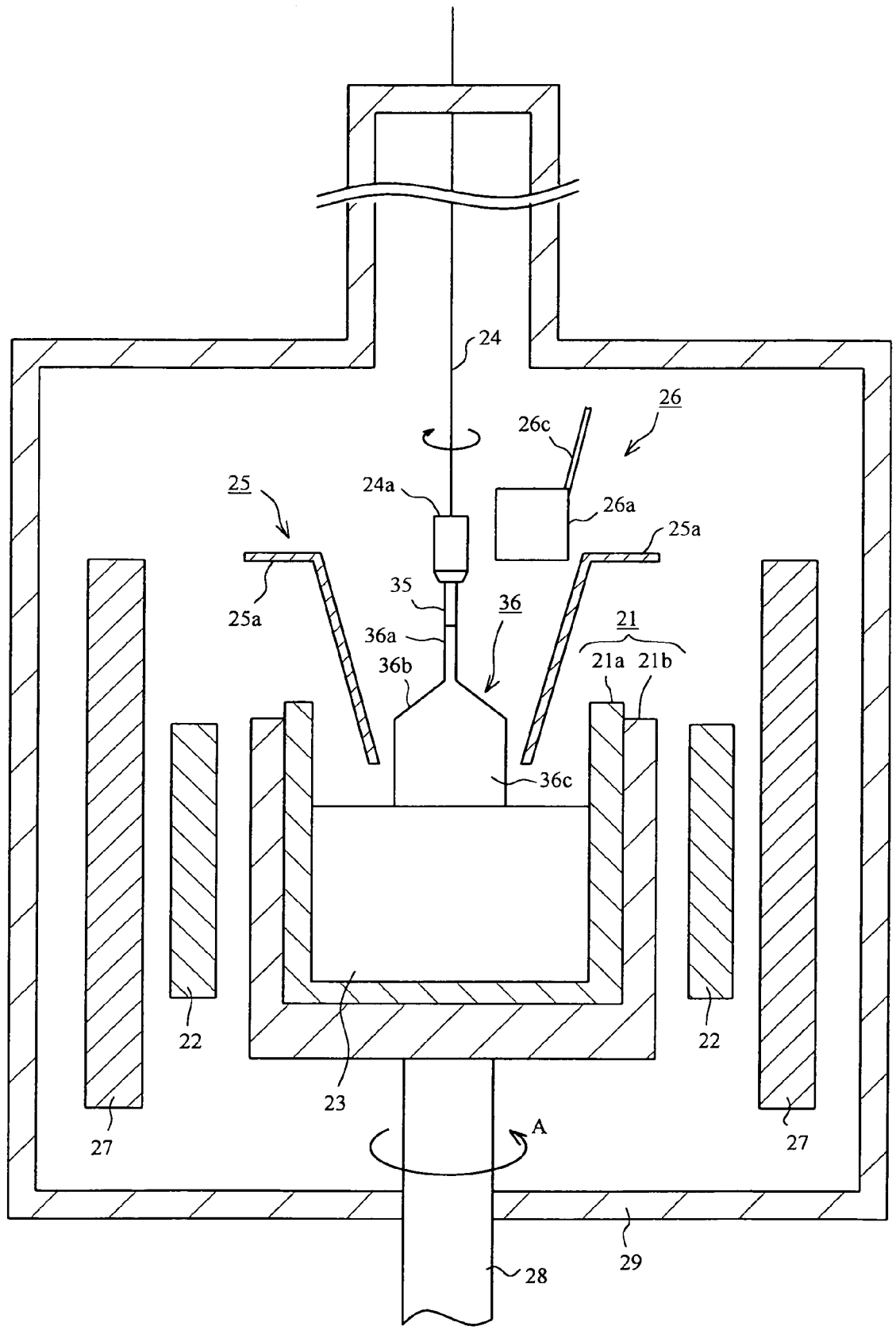
FIG. 9 is a partly sectional view schematically showing a principal part of a conventional apparatus for pulling a single crystal.
Figure 11A:
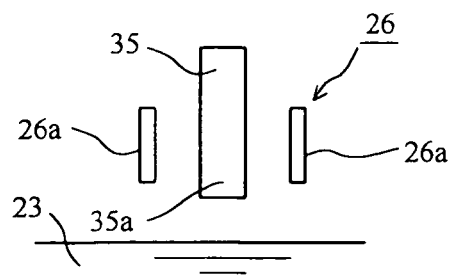
FIGS. 11(a)–11(e) are enlarged partial front views schematically showing a seed crystal and the vicinity thereof in part of steps of single crystal pulling using a conventional apparatus for pulling a single crystal.
Figure 11B:
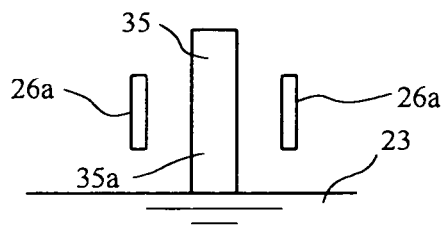
Figure 11C:
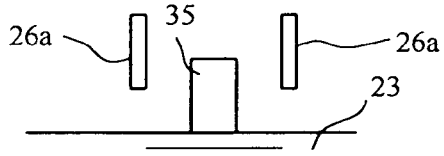
Figure 11D:
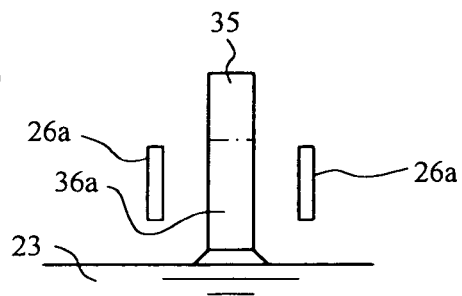
Figure 11E:
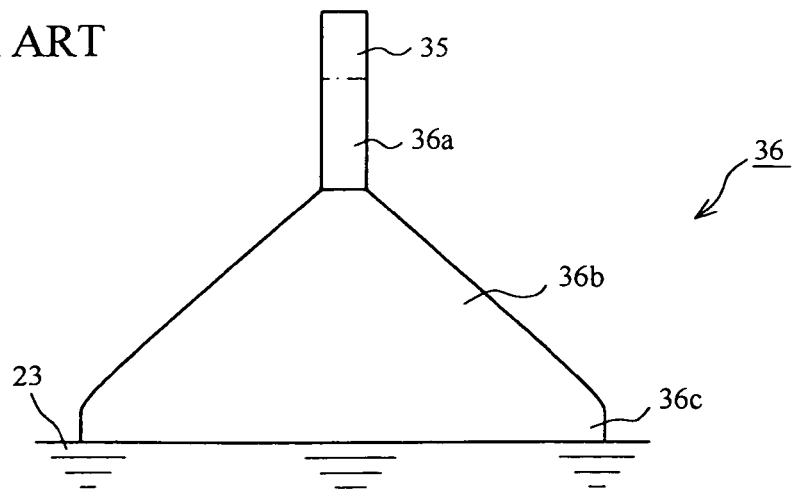

Preferred embodiments of an apparatus and a method for pulling a single crystal according to the present invention are described below by reference to the Figures of the drawings. Here, components having same functions as those of the conventional apparatus for pulling a single crystal shown in FIG. 9 are similarly marked and are not described below.

It is premised that a single crystal having a large diameter of at least 12 inches (about 300 mm), or a heavy single crystal is pulled using an apparatus for pulling a single crystal according to this embodiment.

Figure 1:
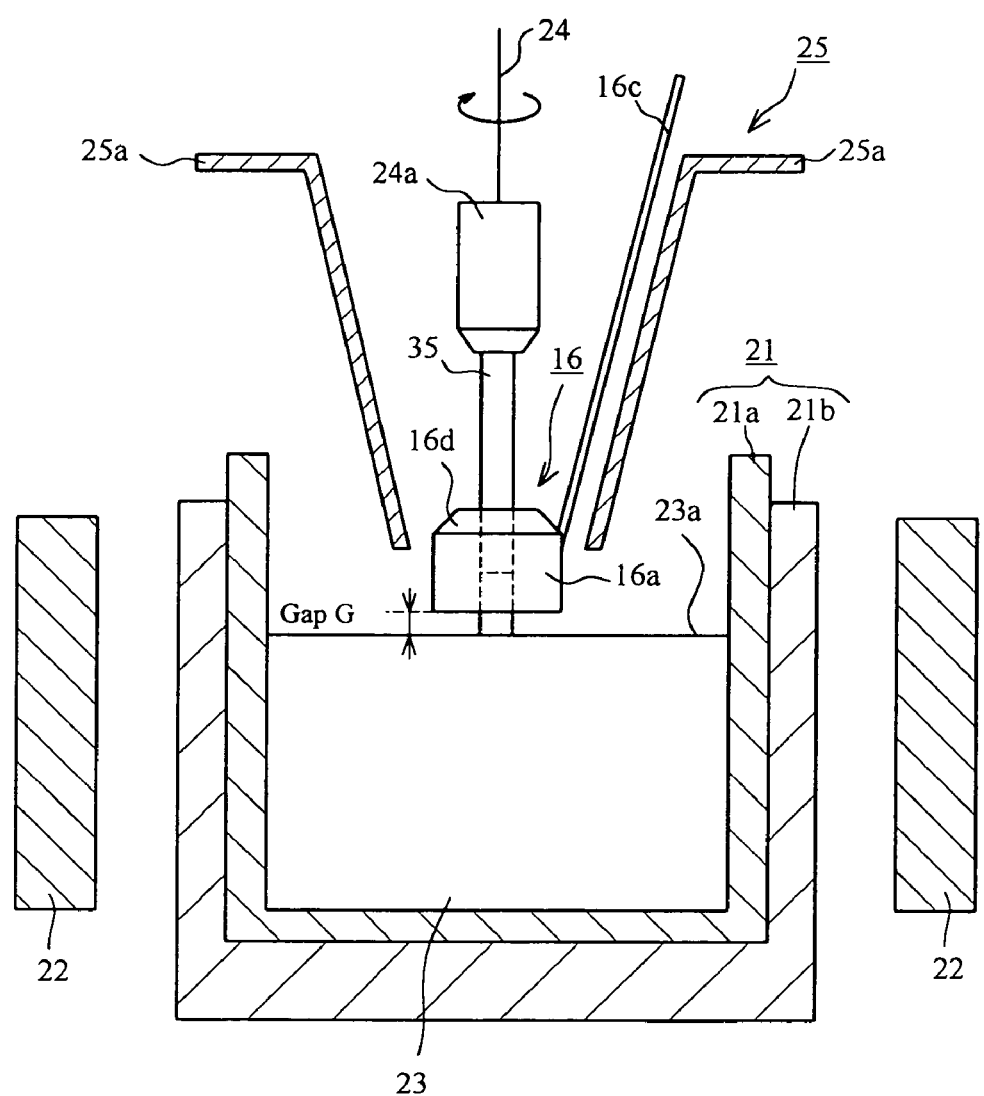
FIG. 1 is a partly sectional view schematically showing a principal part of a first apparatus for pulling a single crystal according to an embodiment of the present invention.
Figure 2A:
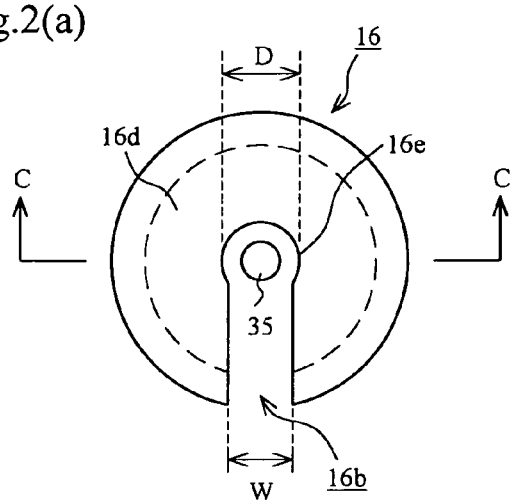
Figure 2B:
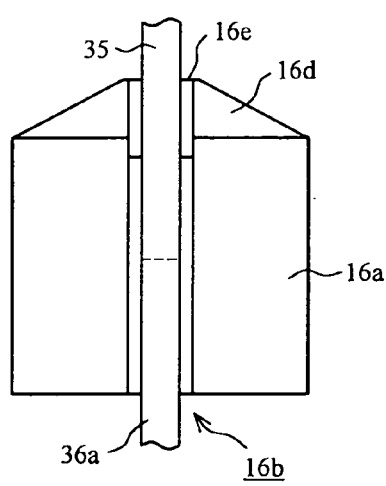
Figure 2C:
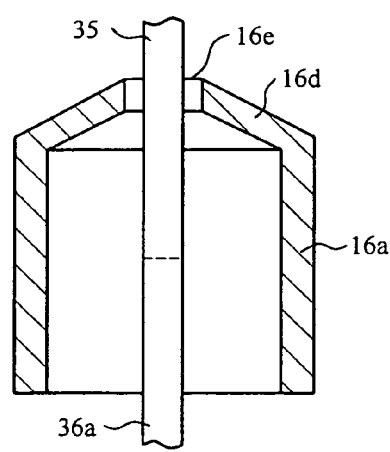

FIG. 1 is a sectional view schematically showing a principal part of an apparatus for pulling a single crystal according to an embodiment. FIGS. 2(a)–2(c) are diagrams schematically showing a principal part of an auxiliary heating device in this apparatus for pulling a single crystal, wherein FIG. 2(a) is a plan view, FIG. 2(b) is a front view and FIG. 2(c) is a sectional view along line C—C of FIG. 2(a).

Figure 4A:
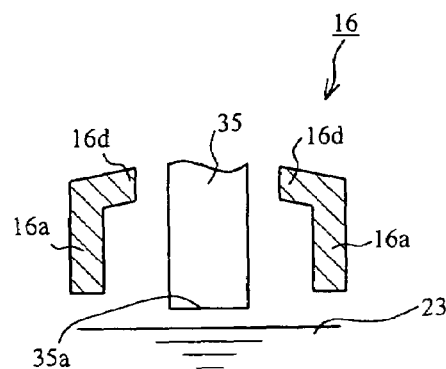
FIGS. 4(a)–4(e) are enlarged partial front views schematically showing a seed crystal and the vicinity thereof in part of steps of single crystal pulling using the apparatus for pulling a single crystal according to the first embodiment.
Figure 4B:
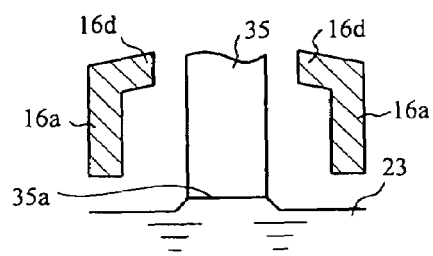
Figure 4C:
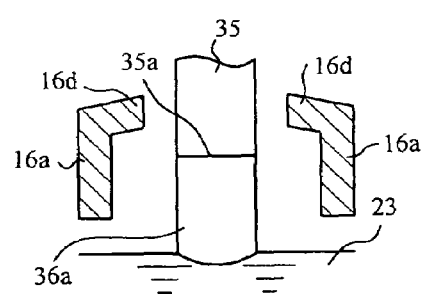
Figure 4D:
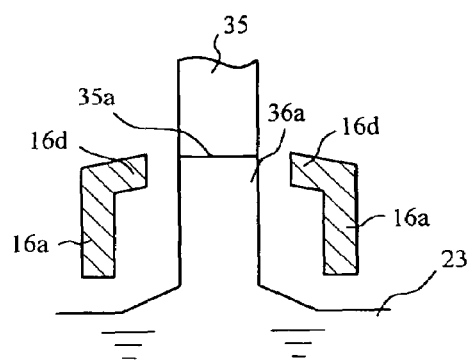
Figure 4E:
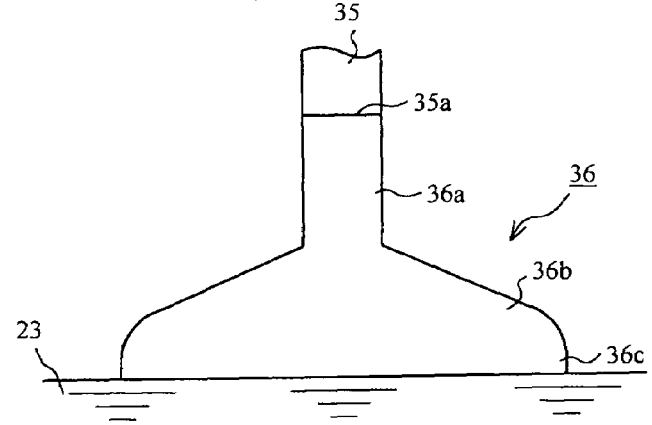

Reference numeral 16 in these figures represents an auxiliary heating device. As shown in FIGS. 2(b) and 2(c), the auxiliary heating device 16 comprises a heating section 16a almost in the shape of a cylinder, which can be located so as to surround a seed crystal 35 in a position near above a melt 23, and a covering section 16d almost in the shape of a truncated cone in a side view extended inwardly in a direction oblique and upward from a top end of the heating section 16a. As shown in FIG. 1, the auxiliary heating device further comprises an electrode 16c for supplying power to the heating section 16a and for supporting the heating section 16a, while descending or ascending therefrom so as to maintain an angle therewith. The auxiliary heating device also comprises a transfer mechanism (not shown) for withdrawing the heating section 16a from a passing area of a single crystal 36 (FIG. 4(e)) during formation of a main body 36c (FIG. 4(e)) after forming a neck 36a.

In the heating section 16a and the covering section 16d, a side opening 16b for withdrawing therefrom the seed crystal 35 is formed. On a top of the covering section 16d, a top opening 16e for allowing the seed crystal 35, or neck 36a, to pass therethrough is formed. The top opening 16e and the side opening 16b are formed to be joined to each other.

Diameter D of the top opening 16e is set within a range of 1.25–3.0 times a diameter of seed crystal 35 to be used. Width W of the side opening 16b is also set within the range of 1.25–3.0 times the diameter of the seed crystal 35 to be used. The covering section 16d functions not as a heating section but as a heat insulating section in the present embodiment.

At least the heating section 16a and the covering section 16d of the auxiliary heating device 16 are made of a carbon material and a silicon carbide material coated on a surface of the carbon material, and the transfer mechanism is desirably made of the carbon material and the silicon carbide material coated on a surface of this carbon material. By making the auxiliary heating device 16 of the carbon material and the silicon carbide material coated on the surface of the carbon material, it is possible to prevent an occurrence of events where impurities are released from the heating section 16a or the covering section 16d, and adversely affect a single crystal to be pulled, even if the heating section 16a or the covering section 16d becomes hot.

Gap G between a lower end of the heating section 16a and the melt surface 23a is set to be a distance at which the melt 23 and the heating section 16a are unlikely to come into contact with each other, and a front portion 35a of seed crystal 35 can be efficiently made hot before contact with the melt 23, within the range of 5 to 30 mm, for example. A gap G of less than 5 mm is not preferable because there is a risk of contact with the melt 23. And, a gap G of greater than 30 mm is not preferable because a reduced temperature gradient required for excluding dislocations on a solid-liquid interface becomes hard to achieve.

Here, the covering section 16d of the auxiliary heating device 16 according to the embodiment is assembled as a heat insulating section, but in an auxiliary heating device according to another embodiment, a covering section may be assembled as a heating section. By arranging the covering section as a heating section, a radial temperature gradient of the seed crystal 35 or the neck 36a can be made much smaller.

Figure 3A:
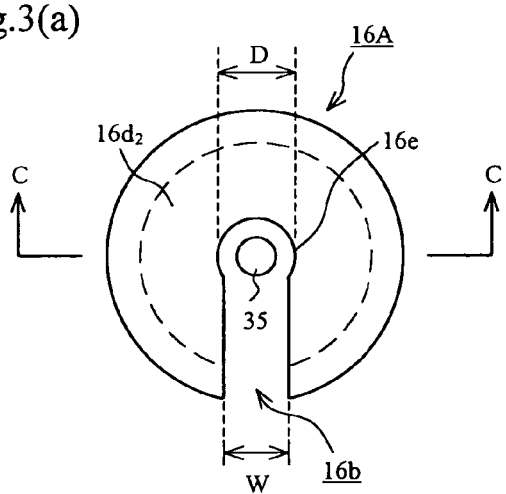
Figure 3B:
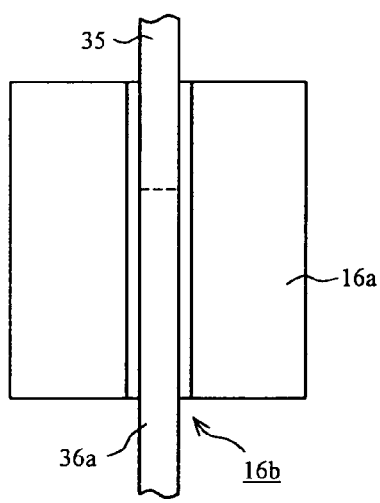
Figure 3C:
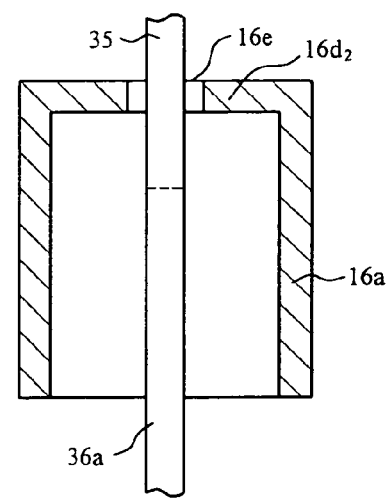

In the above embodiment, the covering section 16d being almost in the shape of a truncated cone in a side view inwardly extended in a direction oblique and upward from the top of the heating section 16a is described, but an arrangement position and shape of the covering section 16d are not limited to these. For example, a covering section $16d_2$ horizontally extended from the upper inner wall of the heating section 16a may be formed as shown in FIG. 3(*c*). It is essential only that provided is a covering section, of a shape which enables covering a clearance between the heating section 16a and the single crystal 35, may be extended from the heating section in order to make a radial temperature gradient of the seed crystal 35 or the neck 36a smaller.

A method for pulling a single crystal using the apparatus for pulling a single crystal according to the above embodiment is described below. FIGS. 4(*a*)–4(*e*) are enlarged partial front views schematically showing the seed crystal 35 and the vicinity thereof in part of steps in the method for pulling a single crystal according to the embodiment.

The steps prior to the below-described steps are conducted in the same manner as the method described in the "Description of the Relevant Art".

While a pulling axis 24 (FIG. 1) is rotated on the same axis in a reverse direction of a support shaft 28 (FIG. 9) at a prescribed speed, the seed crystal 35 held by a holder 24a (FIG. 1) is caused to descend close to the melt 23 and is preheated so that a temperature of a front portion 35a of the seed crystal 35 is raised (FIG. 4(*a*)).

By reducing a diameter of the seed crystal 35, a thermal capacity of the front portion 35a thereof decreases, so that a change in temperature when bringing the seed crystal 35 into contact with the melt 23 becomes smaller. A radial temperature gradient in contact with the melt 23 becomes smaller, active thermal stress decreases, and a number of induced dislocations in contact with the melt 23 can be reduced. However, when diameter D of the seed crystal 35 is less than 8 mm, it becomes difficult to stably support a single crystal 36 having a diameter of about 12 inches and a weight exceeding 300 kg. On the other hand, when the diameter D of the seed crystal 35 exceeds 14 mm, it is large enough to support the single crystal 36, but uniform heating using the auxiliary heating device 16 becomes difficult because of the too large diameter of the seed crystal 35. Since thermal stress generated in the seed crystal 35 increases, it becomes difficult to exclude dislocations. As a result, the diameter D of the seed crystal 35 is preferably set within a range of 8–14 mm.

By spending about 5 to 60 minutes on preheating, the temperature of the front portion 35a of the seed crystal 35 is raised to about 1200–1300° C. A distance between the melt 23 and the front portion 35a of the seed crystal 35 during the preheating before contact is preferably set within a range of 1 to 30 mm. In order to make the temperature of the seed crystal 35 as close as possible to a surface temperature of the melt 23, the distance is more preferably set to be at most 5 mm.

After the preheating, the front portion 35a of the seed crystal 35 is further heated using the auxiliary heating device 16 so as to raise the temperature of the front portion 35a thereof up to 1380–1420° C. If the temperature of the front portion 35a thereof is 1380° C. or higher, occurrence of dislocations caused by thermal stress can be remarkably inhibited during a process of descending the seed crystal 35 to bring the front portion 35a thereof into contact with the melt 23.

However, if the temperature of the front portion 35a of the seed crystal 35 exceeds 1420° C., the seed crystal 35 begins to melt at a portion close to the auxiliary heating device 16 and there is a possibility of fusion thereof during the process of descending the seed crystal 35 to bring the front portion 35a thereof into contact with the melt 23, when the temperature of the melt 23 is higher than expected or when a temperature variation of the surface of the melt 23 is wide.

The seed crystal 35 is caused to descend and the front portion 35a thereof is brought into contact with the melt 23 (FIG. 4(*b*)). During this contact with the melt 23, a difference in temperature between the front portion 35a of the seed crystal 35 and the melt 23 is small, so that thermal stress caused by this temperature difference in the seed crystal 35 is small. Therefore, when a dislocation-free seed crystal is used as the seed crystal 35, there is little chance of induction of dislocations. And even when the seed crystal 35 is brought into contact with the melt 23 again during re-pulling using the seed crystal 35 containing a few dislocations such as a seed crystal obtained after a single crystal 36 is remelted because of induction of dislocations thereto during pulling thereof, the dislocations do not propagate or extend.

Then, a crystal is made to grow at the lower end of the seed crystal 35. The pulling axis 24 is pulled at a higher rate than the below-described formation speed of the main body 36c, and a shape of a growth interface of the single crystal 36 (a lower end surface of the neck 36a) is made downward convex so as to form the neck 36a (FIG. 4(*c*)). Using the apparatus according to this embodiment, the neck 36a having a large diameter in which dislocations can be excluded can be formed. That is because an amount of radiation from the heating section 16a to growing neck 36a increases, so that a heat distribution inside a crystal of the neck 36a becomes flat and thermal stress is reduced, thereby resulting in a higher capability of excluding dislocations from the neck 36a.

A diameter of the neck 36a is preferably in a range of 7–12 mm. When it is larger than 12 mm, a flat thermal distribution cannot be easily obtained during growth of the neck 36a, so that thermal stress becomes larger, thereby resulting in a reduced capability of excluding dislocations. Therefore, when the seed crystal 35 having a diameter within a range of 8 to 12 mm is used, the neck 36a having the same diameter as the seed crystal 35 may be formed. When the seed crystal 35 having a diameter exceeding 12 mm is used, the diameter thereof may be reduced so that the neck 36a has a diameter of at most 12 mm.

Even if a few dislocations are left because a perfectly dislocation-free crystal could not be obtained by melting the seed crystal 35, thermal stress of the neck 36a is reduced, dislocations are excluded during formation of the neck 36a, and single crystal 36 grown at the lower portion of the neck 36a is reliably made dislocation-free. Therefore, when the neck 36a is pulled, it is desirable to continuously heat the vicinity of the neck 36a using the auxiliary heating device 16.

Then, power supply to the auxiliary heating device 16 is stopped, the heating section 16a is withdrawn from a periphery of the neck 36a, and thereafter, the single crystal 36 is made to grow to have a prescribed diameter (about 12 inches), resulting in formation of a shoulder 36b. Then, the single crystal 36 is pulled at a prescribed pulling speed so as to form the main body 36c (FIGS. 4(*d*) and 4(*e*)).

Then, the single crystal 36 is pulled in almost the same manner as the method described in the "Description of the Relevant Art", is separated from the melt 23 and is cooled, which is completion of the pulling of the single crystal 36.

Here, in the above embodiment, a case where the present invention is applied to the CZ method was described, but the application of the present invention is not limited to the CZ method. Likewise, it is applicable to the MCZ method wherein a magnetic field is applied, for example.

In the above embodiment, a case where the seed crystal 35 is almost cylindrical was described, but in another embodiment, the seed crystal may be a polygonal prism. In this case, a diameter of a neck may be within a range of 7 to 12 mm likewise.

Only a method for pulling a single crystal using the apparatus for pulling a single crystal according to the above embodiment in a case where an amount of radiation to each of the seed crystal 35 and the neck 36a is increased by heating with the heating section 16a was described, but needless to say, the single crystal 36 can be pulled with an increase in radiation amount only to the seed crystal 35 without forming the neck 36a, or the single crystal 36 can be pulled with an increase in radiation amount only to the neck 36a so as to enhance a capability of excluding dislocations from the neck 36a.

Figure 5:
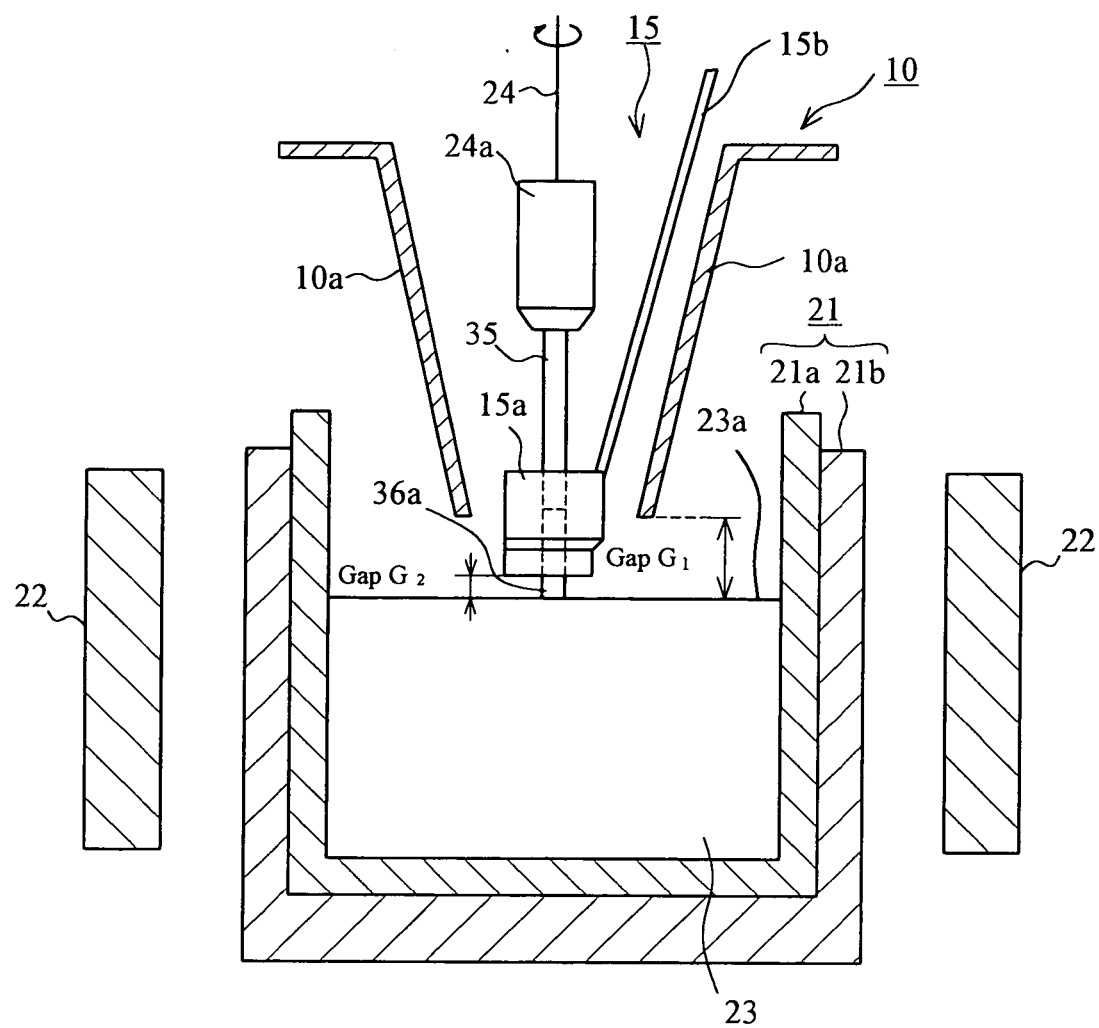
FIG. 5 is a partly sectional view schematically showing a principal part of an apparatus for pulling a single crystal according to a third embodiment.
Figure 6A:
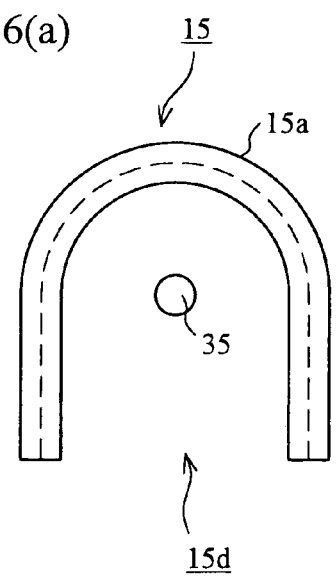
FIGS. 6(a)–6(c) are a plan view, a front view and a side view, respectively, schematically showing a form of the heating section according to the third embodiment.
Figure 6B:
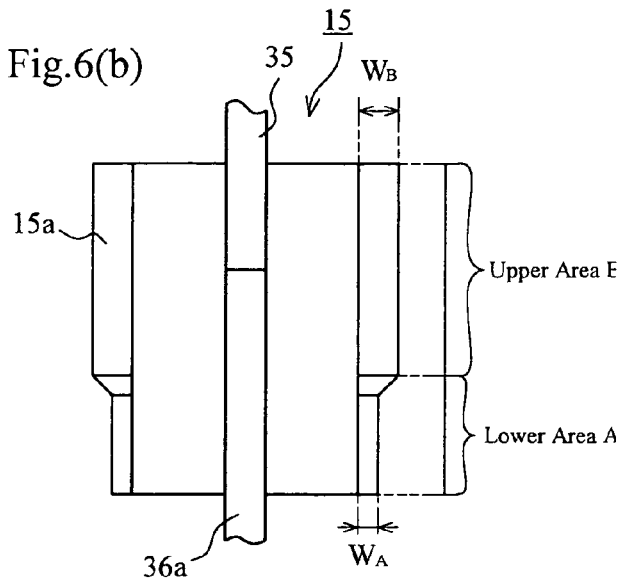
Figure 6C:
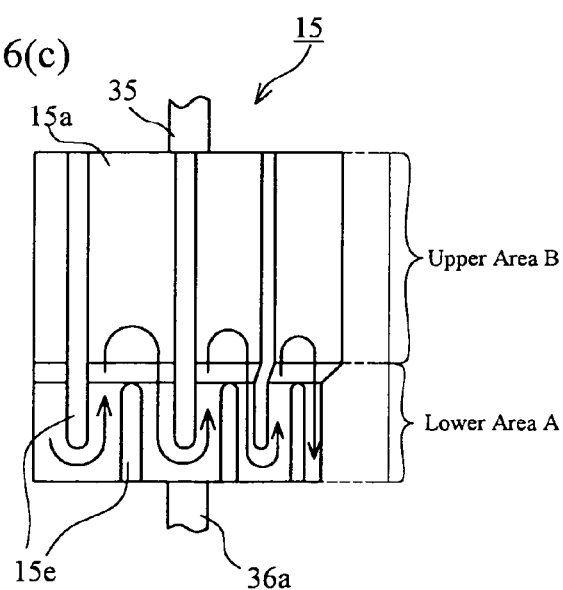

FIG. 5 is a partly sectional view schematically showing a principal part of an apparatus for pulling a single crystal according to another embodiment. FIGS. 6(a)–6(c) are a plan view, a front view and a side view, respectively, schematically showing a heating section of an auxiliary heating device in this apparatus for pulling a single crystal.

Reference numeral 10 in FIG. 5 represents a straightening vane. A main body 10a of the straightening vane 10 has a shape of an inverted truncated cone in a side view, is located so as to surround a pulled single crystal, and is arranged so that a lower end portion thereof can be positioned near above a melt 23 filled in a crucible 21. Gap $G_1$ between a melt surface 23a and the lower end portion of the straightening vane 10 is set to be about 75 mm.

Reference numeral 15 in FIG. 5 represents an auxiliary heating device. The auxiliary heating device 15 comprises, as shown in FIGS. 6(a) and 6(b), a heating section 15a being U-shaped in a plan view, which surrounds at least half of a horizontal perimeter of a seed crystal 35 and has an opening 15d for withdrawing from the seed crystal 35, and which can be located so as to surround the seed crystal 35 in a position near above the melt 23. As shown in FIG. 5, the auxiliary heating device 15 further comprises an electrode 15b for supplying power to the heating section 15a, and for supporting the heating section 15a in a descending or ascending manner so as to maintain an angle, therebetween. The auxiliary heating device also comprises a transfer mechanism (not shown) for withdrawing the heating section 15a from a passing area of a single crystal during formation of a main body 36c after forming a neck 36a.

The heating section 15a consists of a heater of a resistance heating type having slits 15e formed at prescribed intervals alternately in an upper area B and a lower area A. Thickness $W_A$ of the lower area A of the heating section 15a is formed to be smaller than thickness $W_B$ of the upper area B thereof. In the heating section 15a, electricity flows between the slits 15e as shown by arrows in FIG. 6(c).

Because of the thickness $W_A$ of the lower area A being smaller than the thickness $W_B$ Of the upper area B, a resistance value in the thickness $W_A$ becomes higher, and a heating strength in the lower area A is made higher than a heating strength in the upper area B. A heating strength ratio of the upper area B of the heating section 15a to the lower area A thereof is set within a range of 1:2.0–5.0.

The lower area A thereof is set within a range of 2 to 15 mm high from a lower end of the heating section 15a, when the height of the heating section 15a is 50 mm, for example. Gap $G_2$ between the lower end of the heating section 15a and the melt surface 23a is set to be a distance at which the melt 23 and the heating section 15a are unlikely to come into contact with each other and the front portion 35a of the seed crystal 35 can be efficiently made hot, within the range of 5 to 30 mm, for example. Gap $G_2$ being less than 5 mm is not preferable because there is a risk of contact with the melt 23. And the gap $G_2$ exceeding 30 mm is not preferable because a reduced temperature gradient required for excluding dislocations from a solid-liquid interface becomes hard to be achieved.

A heating power of the heating section 15a can be set within a range of 30 to 80% of a seed melt power which causes melting of the front portion 35a of the seed crystal 35. When the heating power is less than 30% of the seed melt power, it becomes difficult to realize a phenomenon of a temperature gradient required for excluding dislocations from the solid-liquid interface. When the heating exceeds 80% of the seed melt power, a heat balance between a melt temperature directly below the heating section 15a and a temperature of an outer region of the melt comes undone, so that the outer region of the melt becomes colder, resulting in occurrence of crystal precipitation, which is a difficult condition for pulling a single crystal.

At least the heating section 15a of the auxiliary heating device 15 is made of a carbon material and a silicon carbide material coated on a surface of the carbon material, and the transfer mechanism is desirably made of the carbon material and silicon carbide material coated on a surface of this carbon material. By making the auxiliary heating device 15 of the carbon material and the silicon carbide material coated on the surface of the carbon material, it is possible to prevent occurrence of events where impurities are released from the heating section 15a and adversely affect the single crystal 36 to be pulled, even if the heating section 15a becomes hot.

The heating section 15a of the auxiliary heating device 15 shown in FIGS. 6(a)–6(c) consists of a curved material being U-shaped in a plan view having opening 15d, but in an apparatus for pulling a single crystal according to another embodiment, a heating section 150a constituting an auxiliary heating device 150 may consist of multiple movable heating sections 150a, which may be almost cylindrical so as to be able to surround almost an entire horizontal perimeter of a seed crystal 35. Such whole-circumferential heating section 150a having a segmental construction is preferable from a viewpoint of uniform heating of the seed crystal 35 and a neck 36a. Here, in this case, thickness $W_A$ of lower area A of the heating section 150a is formed so as to be smaller than thickness $W_B$ of upper area B thereof.

A method for pulling a single crystal using the apparatus for pulling a single crystal according to the above embodiment is described below. FIGS. 8(a)–8(e) are enlarged partial front views schematically showing seed crystal 35 and the vicinity thereof in part of steps in the method for pulling a single crystal according to the embodiment.

The steps prior to the below-described steps are conducted in the same manner as the method described in the "Description of the Relevant Art".

Figure 8A:
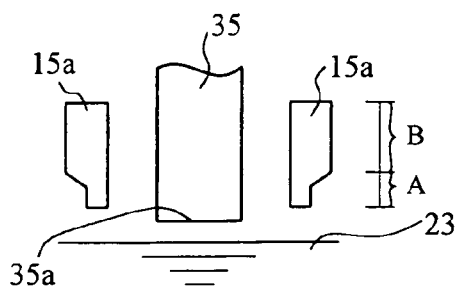
FIGS. 8(a)–8(e) are enlarged partial front views schematically showing a seed crystal and the vicinity thereof in part of steps of single crystal pulling using the apparatus for pulling a single crystal according to the third embodiment.

While a pulling axis 24 (FIG. 5) is rotated on the same axis in a reverse direction of a support shaft 28 (FIG. 9) at a prescribed speed, the seed crystal 35 held by a holder 24a (FIG. 5) is caused to descend close to melt 23 and is preheated so that a temperature of front portion 35a of the seed crystal 35 is raised (FIG. 8(a)).

By reducing a diameter of the seed crystal 35, a thermal capacity of the front portion 35a thereof decreases, so that a temperature change in bringing the seed crystal 35 into contact with the melt 23 becomes smaller. Therefore, a radial temperature distribution in contact with the melt 23 is difficult to occur, active thermal stress becomes smaller, and a number of induced dislocations in contact with the melt 23 decreases. However, when diameter D of the seed crystal 35 is less than 5 mm, it becomes difficult to support a single crystal 36 having a diameter of about 12 inches and a weight exceeding 300 kg. On the other hand, when the diameter D of the seed crystal 35 exceeds 15 mm, it is large enough to support the single crystal 36, but uniform heating using the auxiliary heating device 15 becomes difficult because of the too large seed crystal 35. Accordingly, since thermal stress generated in the seed crystal 35 increases, it becomes difficult to exclude dislocations. As a result, the diameter D of the seed crystal 35 is preferably set within a range of 5–15 mm.

By spending about 5 to 60 minutes on preheating, a temperature of the front portion 35a of the seed crystal 35 is raised to about 1200–1300° C. A distance H between the melt 23 and the front portion 35a of the seed crystal 35 during the preheating before contact is preferably set within a range of 1 to 30 mm. In order to make the temperature of the seed crystal 35 as close as possible to a surface temperature of the melt 23, the distance H is more preferably set to be about 5 mm.

It is desired that after the preheating, the front portion 35a of the seed crystal 35 should be further heated using the auxiliary heating device 15 so as to raise the temperature of the front portion 35a thereof up to 1380–1420° C. If the temperature of the front portion 35a thereof is 1380° C. or higher, occurrence of dislocations caused by thermal stress can be remarkably inhibited during a process of descending the seed crystal 35 to bring the front portion 35a thereof into contact with the melt 23.

However, if the temperature of the front portion 35a of the seed crystal 35 exceeds 1420° C., the seed crystal 35 begins to melt at a portion close to the auxiliary heating device 15 and there is a possibility of fusion thereof during the process of descending the seed crystal 35 to bring the front portion 35a thereof into contact with the melt 23, when the temperature of the melt 23 is higher than expected or when a temperature variation of the surface of the melt 23 is wide.

Figure 8B:
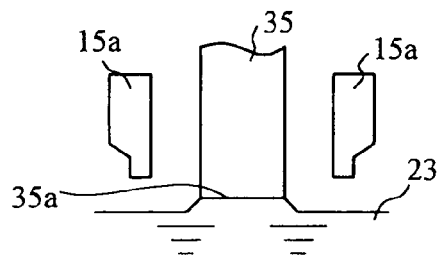
Figure 8C:
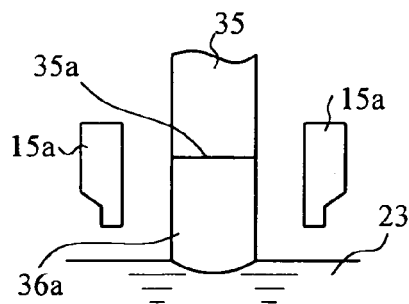
Figure 8D:
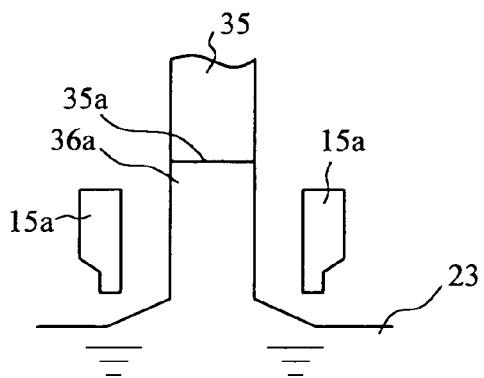
Figure 8E:
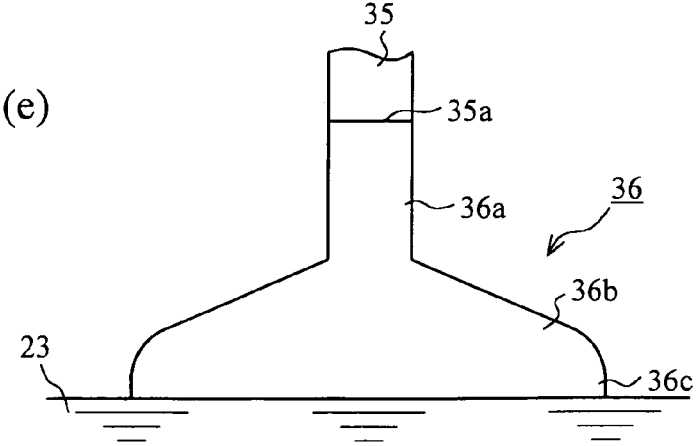

The seed crystal 35 is caused to descend and the front portion 35a thereof is brought into contact with the melt 23 (FIG. 8(b)). During this contact with the melt 23, a difference in temperature between the front portion 35a of the seed crystal 35 and the melt 23 is small, so that thermal stress caused by a temperature difference in the seed crystal 35 is small. Therefore, when a dislocation-free seed crystal is used as the seed crystal 35, there is little chance of induction of dislocations. And even when the seed crystal 35 is brought into contact with the melt 23 again during re-pulling using the seed crystal 35 containing a few dislocations such as a seed crystal obtained after a single crystal 36 is remelted because of induction of dislocations thereto during pulling thereof, the dislocations do not propagate or extend.

Then, a crystal is made to grow at the lower end of the seed crystal 35. At this time, the pulling axis 24 is pulled at a higher rate than the below-described formation speed of the main body 36c, and a shape of a growth interface of the single crystal 36 (a lower end surface of the neck 36a) is made downward convex so as to form neck 36a (FIG. 8(c)). Using the apparatus according to this embodiment, the neck 36a having a large diameter from which dislocations can be excluded can be formed. That is because an amount of radiation from the heating section 15a to the growing neck 36a increases, so that a heat distribution inside a crystal of the neck 36a becomes flat and thermal stress is reduced, thereby resulting in a higher capability of excluding dislocations from the neck 36a.

A diameter of the neck 36a is preferably in a range of 7–12 mm. When it is larger than 12 mm, a flat thermal distribution cannot be easily obtained during growth of the neck 36a, so that thermal stress becomes larger, resulting in a reduced capability of excluding dislocations. Therefore, when the seed crystal 35 having a diameter within the range of 7 to 12 mm is used, the neck 36a having the same diameter as the seed crystal 35 may be formed. When the seed crystal 35 having a diameter exceeding 12 mm is used, the diameter thereof may be reduced so that the neck 36a has a diameter of at most 12 mm.

Even if a few dislocations are left because a perfectly dislocation-free crystal could not be obtained by melting the seed crystal 35, thermal stress of the neck 36a is reduced, dislocations are excluded during the formation of the neck 36a, and the single crystal 36 grown at the lower portion of the neck 36a is reliably made dislocation-free. Therefore, when the neck 36a is pulled, it is desirable to continuously heat the vicinity of the neck 36a using the auxiliary heating device 15.

Then, power supply to the auxiliary heating device 15 is stopped, the heating section 15a is withdrawn from a periphery of the neck 36a, and thereafter, the single crystal 36 is made to grow to have a prescribed diameter (about 12 inches), resulting in formation of a shoulder 36b. Then, the single crystal 36 is pulled at a prescribed pulling speed so as to form main body 36c (FIGS. 8(d) and 8(e)).

Then, the single crystal 36 is pulled in almost the same manner as the method described in the "Description of the Relevant Art", is separated from the melt 23 and is cooled, which is completion of the pulling of the single crystal 36.

Here, in the above embodiment, a case where the present invention is applied to the CZ method was described, but application of the present invention is not limited to the CZ method. Likewise, it is applicable to the MCZ method wherein a magnetic field is applied, for example.

In the above embodiment, a case where the seed crystal 35 is almost cylindrical was described, but in another embodiment, the seed crystal may be a polygonal prism. In this case, the diameter of a neck may be within the range of 7 to 12 mm.

Only a method for pulling a single crystal using the apparatus for pulling a single crystal according to the above embodiment in a case where an amount of radiation to each of the seed crystal 35 and the neck 36a is increased by heating with the heating section 15a was described, but needless to say, the single crystal 36 can be pulled with an increase in radiation amount only to the seed crystal 35 without forming the neck 36a, or the single crystal 36 can be pulled with an increase in radiation amount only to the neck 36a so as to enhance a capability of excluding dislocations from the neck 36a.

EXAMPLES AND COMPARATIVE EXAMPLES

Examples and Comparative Examples are described below.

[Common Conditions to Examples 1–20 and Comparative Examples 1–3]

| | |
|---|---|
| Prepared quantity of material for crystal | 260 kg |
| Atmosphere in chamber 29 | Ar atmosphere |
| Flow of Ar | 160 liter per minute |
| Pressure in chamber | $4 \times 10^3$–$8 \times 10^3$ Pa |
| Diameter of crucible 21 | 813 mm |

-continued

| Shape of single crystal 36 to be pulled | |
|---|---|
| Diameter | about 300 mm (about 12 inches) |
| Length | about 200 mm |
| Shape of seed crystal 35 | |
| Diameter | 8, 12, 15 or 18 mm |
| Number of pulls | ten times with each condition |

[Conditions of Comparative Examples 1–3]

In Comparative Examples 1–3, using an apparatus for pulling a single crystal (FIGS. 10(a) and 10(b)) having a conventional heating device 26 (wherein a covering section is not extended from a heating section 26a and a heating area of the heating section 26a is 50% of a horizontal perimeter of a seed crystal 35) and seed crystals 35 having different diameters, single crystals 36 were pulled with forming necks 36a having the same diameters as the seed crystals 35, respectively.

[Conditions of Examples 1–20]

In Examples 1–20, using an apparatus for pulling a single crystal according to the embodiment shown in FIG. 1 and seed crystals 35 having different diameters, single crystals 36 were pulled with forming necks 36a having the same diameters as the seed crystals 35, respectively, with variations in diameter of a top opening 16e and width of a side opening 16b of a covering section 16d according to the seed crystals 35. Here, a covering section 16d comprising a heat insulating member and a covering section comprising a heating section were used with every condition.

[A Testing Method (Common to Examples 1–20 and Comparative Examples 1–3)]

With a gap G between a lower end of the heating section 16a and melt 23 kept constant, the heating section 16a, or the heating section 16a and the covering section as a heating section are heated so as to have an appropriate temperature of the seed crystal 35 in contact with the melt 23. Then, the seed crystal 35 is located about 5 mm above melt surface 23a and is brought into contact with the melt 23 after a 30-minute preheating.

After a stabilized condition was achieved, the neck 36a having almost the same diameter as the seed crystal 35 was made grow to be 150 mm long, the heating section 16a was withdrawn from the neck 36a and by increasing the diameter, a main body 36c was made to grow to be 200 mm long. If a break of a crystal axis did not occur in the single crystal within the above growing range, this case was determined as a Dislocation Free (DF) pull.

Thereafter, the single crystal 36 was dissolved into the melt 23 so as to make a quantity of the melt 23 the same as the initial quantity, and a next sample was started to be grown.

Specific conditions and the DF (Dislocation Free) rate of the single crystals 36 with each of the conditions are shown in Table 1. Here, an opening diameter ratio indicates a ratio of a diameter of top opening 16e to a diameter of the seed crystal 35, and an opening width ratio indicates a ratio of a width of side opening 16b to a width (diameter) of the seed crystal 35.

TABLE 1

| | Component of Covering Section | Seed Crystal Diameter (mm) | Mean Neck Diameter (mm) | Opening Diameter Ratio | Opening Width Ratio | DF Rate (%) |
|---|---|---|---|---|---|---|
| Comparative Example 1 | — | 7 | 7.12 | — | 2.86 | 80 |
| Comparative Example 2 | — | 8 | 8.15 | — | 2.50 | 60 |
| Comparative Example 3 | — | 14 | 13.98 | — | 1.43 | 0 |
| Example 1 | Heat Insulating Member | 8 | 8.12 | 1.25 | 1.25 | 100 |
| Example 2 | Heating Member | 8 | 8.10 | 1.25 | 1.25 | 100 |
| Example 3 | Heat Insulating Member | 14 | 14.21 | 1.25 | 1.25 | 100 |
| Example 4 | Heating Member | 14 | 14.14 | 1.25 | 1.25 | 100 |
| Example 5 | Heat Insulating Member | 8 | 7.98 | 3.00 | 1.25 | 100 |
| Example 6 | Heating Member | 8 | 8.06 | 3.00 | 1.25 | 100 |
| Example 7 | Heat Insulating Member | 14 | 13.98 | 3.00 | 1.25 | 90 |
| Example 8 | Heating Member | 14 | 14.10 | 3.00 | 1.25 | 100 |
| Example 9 | Heat Insulating Member | 8 | 8.20 | 4.00 | 1.25 | 100 |
| Example 10 | Heating Member | 8 | 8.12 | 4.00 | 1.25 | 100 |
| Example 11 | Heat Insulating Member | 14 | 14.25 | 4.00 | 1.25 | 50 |
| Example 12 | Heating Member | 14 | 14.05 | 4.00 | 1.25 | 70 |
| Example 13 | Heat Insulating Member | 8 | 7.89 | 3.00 | 3.00 | 100 |
| Example 14 | Heating Member | 8 | 8.01 | 3.00 | 3.00 | 100 |
| Example 15 | Heat Insulating Member | 14 | 13.95 | 3.00 | 3.00 | 90 |
| Example 16 | Heating Member | 14 | 14.25 | 3.00 | 3.00 | 100 |
| Example 17 | Heat Insulating Member | 8 | 8.06 | 3.00 | 4.00 | 60 |
| Example 18 | Heating Member | 8 | 8.11 | 3.00 | 4.00 | 90 |

TABLE 1-continued

|  | Component of Covering Section | Seed Crystal Diameter (mm) | Mean Neck Diameter (mm) | Opening Diameter Ratio | Opening Width Ratio | DF Rate (%) |
|---|---|---|---|---|---|---|
| Example 19 | Heat Insulating Member | 14 | 14.11 | 3.00 | 4.00 | 20 |
| Example 20 | Heating Member | 14 | 14.03 | 3.00 | 4.00 | 50 |

As is obvious from the results of Comparative Examples 1–3 shown in Table 1, in a case of the apparatus having the conventional heating section 26a being U-shaped in a plan view, the larger the diameter of the used seed crystal 35 was, the lower the DF rate was. The DF rate was 60% in the case of the seed crystal having a diameter of 8 mm which enables stable holding of a heavy crystal having a weight of 300 kg. The DF rate in Comparative Example 3, wherein a seed crystal having a diameter of 14 mm was used, was 0%. When the diameter of the seed crystal was at lest 14 mm, the pulled single crystal could not be made dislocation-free.

As is obvious from the results of Examples 1–4, when both the opening diameter ratio and the opening width ratio were set to be 1.25, the DF rate in each case was preferably 100%.

As is obvious from the results of Examples 5–8, when the opening diameter ratio was set to be 3.00 and the opening width ratio was set to be 1.25, the DF rate was 100% if the diameter of the seed crystal 35 was 8 mm in either case of the covering section being a heat insulating section and that being a heating section (Examples 5 and 6). On the other hand, when the diameter of the seed crystal 35 was 14 mm, the DF rate was 100% in the case of the covering section functioning as a heating section (Example 8), but in the case of the covering section 16d functioning as a heat insulating section (Example 7), the DF rate was 90%. This appears to be because heat radiation upward from the top opening 16e increased by the higher opening diameter ratio, so that a heat insulating effect of the heat insulating section was a little lowered.

As is obvious from the results of Examples 9–12, when the opening diameter ratio was set to be 4.00 and the opening width ratio was set to be 1.25, the DF rate was preferably 100% in either case of the covering section functioning as a heat insulating section and that functioning as a heating section if the diameter of the seed crystal 35 was 8 mm (Examples 9 and 10). On the other hand, when the diameter of the seed crystal 35 was 14 mm with the covering section functioning as a heating section (Example 12), the DF rate decreased to 70%, and with the covering section 16d functioning as a heat insulating section (Example 11), the DF rate decreased to 50%. This appears to be because heat radiation upward from the top opening 16e further increased by the further higher opening diameter ratio, so that a heat radiation inhibiting effect of the covering section 16d was lowered. When the opening diameter ratio was increased to 4.00, a radial temperature gradient of the seed crystal 35 could not be made smaller even with the covering section functioning as a heating section.

As is obvious from the results of Examples 13–16, when both the opening diameter ratio and the opening width ratio were set to be 3.00, the DF rate was preferably 100% in either case of the covering section 16d functioning as a heat insulating section (Example 13) and the covering section functioning as a heating section (Example 14) if the diameter of the seed crystal 35 was 8 mm. When the diameter of the seed crystal 35 was 14 mm with the covering section as a heating section (Example 16), the DF rate was 100%, but with the covering section 16d as a heat insulating section (Example 15), the DF rate was 90%. This appears to be because heat radiation upward from the top opening 16e and sideward from the side opening 16b increased by the higher opening diameter ratio and the higher opening width ratio, so that a heat insulating effect could not be sufficiently shown in the case of the covering section 16d as a heat insulating section.

As is obvious from the results of Examples 17–20, when the opening diameter ratio was set to be 3.00 and the opening width ratio was set to be 4.00 with the seed crystal 35 having a diameter of 8 mm, the DF rate was 90%, being relatively preferable in the case of the covering section functioning as a heating section (Example 18), but in the case of the covering section 16d functioning as a heat insulating section (Example 17), the DF rate decreased to 60%. When the diameter of the seed crystal 35 was 14 mm with the covering section 16d functioning as a heating section (Example 19), the DF rate decreased to 20%, while with the covering section functioning as a heating section (Example 20), the DF rate decreased to 50%. This appears to be because heat radiation upward from the top opening 16e and sideward from the side opening 16b further increased by the further higher opening diameter ratio and the further higher opening width ratio, so that a heat radiation inhibiting effect by the covering section was lowered. When the opening diameter ratio was increased to 4.00, even in the case of the covering section functioning as a heating section, a vertical temperature gradient of the seed crystal 35 could not be made smaller.

From the results of Examples 1–20 and Comparative Examples 1–3:

① by arranging the covering section 16d on the clearance between the heating section 16a and the seed crystal 35, a radial temperature gradient of the seed crystal 35 or the neck 36a became smaller, so that thermal stress was reduced. As a result, a capability of excluding dislocations could be enhanced, and it was confirmed that the Dislocation Free rate of the pulled single crystals could be improved even if a seed crystal having a large diameter was used, compared with Comparative Examples 1–3 wherein no covering section was arranged; and ② it was confirmed that it is possible to improve the Dislocation Free rate of pulled single crystals by setting a suitable diameter of the top opening 16e and a suitable width of the side opening 16b according to the diameter of the seed crystal 35.

Examples using the apparatus and the method for pulling a single crystal shown in FIGS. 5–8 are described below. As a Comparative Example, a case where a neck was formed with heating by a conventional heating section without a lower area A having an enhanced heating strength is described. The conditions are shown below.

[Common Conditions to Examples 21–35 and Comparative Example 4]

| | |
|---|---|
| Prepared quantity of material for crystal | 260 kg |
| Atmosphere in chamber 29 | Ar atmosphere |
| Flow of Ar | 160 liter per minute |
| Pressure in chamber | 1.33 × 10³ Pa |
| Diameter of crucible 21 | 813 mm |
| Diameter of neck 36a | 7–8 mm |
| Shape of single crystal 36 to be pulled | |
| Diameter | about 300 mm (12 inches) |
| Length | about 200 mm |
| Shape of seed crystal 35 | |
| Diameter | 8 mm |
| Height of auxiliary heating device 15 or 25 | 50 mm |
| Number of pulls | ten times |

Specific conditions, and the DF (Dislocation Free) rate of the single crystals 36 and a formation speed of the neck 36a with each of the conditions are shown in Table 2. In Comparative Example 4, an apparatus for pulling a single crystal including an auxiliary heating device 26 having a conventional heating section 26a, without a lower area A where the heating strength is enhanced, was used. In Examples 21–35, using the apparatus for pulling a single crystal according to the above embodiment shown in FIGS. 5–8, the neck 36a was formed with variations in ① height of the lower area A of the heating section 15a, ② heating strength ratio of the upper area B to the lower area A (upper-to-lower ratio of the heating strength), ③ distance (gap $G_2$) between a lower end of the heating section 15a and the melt surface 23a and ④ heating power of the heating section 15a (relative strength to the seed melt power), respectively.

Here, the DF (Dislocation Free) rate in Table 2 indicates a rate of dislocation-free (DF) pulls in ten pulls. For determining whether dislocation-free (DF) or not, a prescribed diameter-increasing operation (a shoulder formation) was conducted after forming the neck, and a main body 36c having a diameter of about 300 mm was pulled so as to be 200 mm long. If a break of a crystal axis did not occur within a range of the above pulling operation, this case was determined as a Dislocation Free (DF) pull. The formation speed of the neck 36a indicates a mean speed under each condition.

TABLE 2

| | Height of Lower Area A (mm) | Ratio of Heating Strength Upper:Lower = 1:X | Gap $G_2$ (mm) | Heating Power (Relative Strength to Seed Melt Power) (%) | D F Rate (%) | Formation Speed (mm/min) | Remarks |
|---|---|---|---|---|---|---|---|
| Comparative Example 4 | 0 | 1.0 | 15 | 50 | 80 | 1.5 or less | Conventional Method |
| Example 21 | 2 | 2.0 | 15 | 50 | 50 | 3.5 | |
| Example 22 | 5 | 2.0 | 15 | 50 | 100 | 3.0 or less | |
| Example 23 | 10 | 2.0 | 15 | 50 | 100 | 2.5 or less | |
| Example 24 | 15 | 2.0 | 15 | 50 | 100 | 0.7 or less | |
| Example 25 | 10 | 5.0 | 15 | 50 | 100 | 2.0 or less | |
| Example 26 | 10 | 6.0 | 15 | 50 | 50 | 1.8 or less | |
| Example 27 | 10 | 5.0 | 5 | 50 | 100 | 1.0 or less | |
| Example 28 | 10 | 5.0 | 10 | 50 | 100 | 1.5 or less | |
| Example 29 | 10 | 5.0 | 20 | 50 | 100 | 3.0 or less | |
| Example 30 | 10 | 5.0 | 30 | 50 | 50 | 3.5 or less | |
| Example 31 | 10 | 5.0 | 15 | 10 | 0 | 5.0 or less | |
| Example 32 | 10 | 5.0 | 15 | 30 | 100 | 3.0 or less | |
| Example 33 | 10 | 5.0 | 15 | 80 | 100 | 1.2 or less | |
| Example 34 | 10 | 5.0 | 15 | 90 | 70 | 0.5 or less | Crystal Precipitation in Melt Outer Region |
| Example 35 | 10 | 5.0 | 15 | 100 | 0 | | Neck Growth Failed Broken Seed Crystal |

<Effect of the Height of the Lower Area A of the Heating Section 15a>

As is obvious from the results of Comparative Example 4 and Examples 21–24 shown in Table 2, the formation speed of the neck 36a was at most 1.5 mm/min in Comparative Example 4 when the heating section 26 without the lower area A was used. On the other hand, in Examples 21–23 when the heating section 15a with the lower area A of 2–10 mm was used, the formation speeds of the neck 36 were 2.5–3.5 mm/min, being about 2 times higher.

This appears to be because a peak level of a heating distribution was shifted to a lower level of the heating section 15a by arranging the lower area A in the heating section 15a, so that heat removal from the neck 36a in the upper area B of the heating section 15a was promoted, resulting in easy crystal solidification.

However, when the lower area A thereof was made smaller to 2 mm as shown in Example 21, the formation speed of the neck 36a was increased to 3.5 mm/min but the DF rate was undesirably 50%. And when the lower area A thereof was made larger to 15 mm as shown in Example 24, the DF rate was 100% but the formation speed of the neck 36a decreased to 0.7 mm/min because of an extremely small temperature distribution on a solid-liquid interface, being impractical.

<Effect of the Heating Strength Ratio in the Heating Section 15a>

As is obvious from the results of Examples 23, 25 and 26 shown in Table 2, when the upper-to-lower ratio of the heating strength in the heating section 15a was the upper: the lower=1:2.0 (Example 23) or 1:5.0 (Example 25), the formation speed of the neck 36a was not more than 2.5 mm/min or not more than 2.0 mm/min, respectively. The formation speed of the neck 36a could be made higher than that in Comparative Example 4, and moreover, the DF rate was 100%, so that the crystals could be made reliably dislocation-free.

On the other hand, when the upper-to-lower ratio of the heating strength was 1:6.0 (Example 26), the DF rate was 50%. That appears to be because the heat balance between the solid-liquid interface and a region thereabove was bad and an amount of heat radiation upward was large, so that it was difficult to secure a temperature gradient required for excluding dislocations.

<Effect of the Distance (Gap $G_2$) Between the Lower End of the Heating Section 15a and the Melt Surface 23a>

As is obvious from the results of Examples 27–30 shown in Table 2, in Examples 27–29 wherein the gap $G_2$ between the lower end of the heating section 15a and the melt surface 23a was set within the range of 5–20 mm, respectively, the DF rate was 100%, so that the crystals could be made reliably dislocation-free. However, when the gap $G_2$ was set to be 30 mm, the DF rate decreased to 50%. This appears to be because with the increase of the gap $G_2$, a temperature distribution on a solid-liquid interface became wide, so that it was difficult to exclude dislocations from the crystal. In order to make the formation speed of the neck 36a higher, the gap $G_2$ is preferably set to be about 20 mm.

<Effect of the Heating Power of the Heating Section 15a>

As is obvious from the results of Examples 31–35 shown in Table 2, when the heating power of the heating section 15a during forming the neck 36a was set to be 10% (Example 31) or 100% (Example 35) of power (seed melt power) for melting a front portion of the seed crystal during preheating, the DF rate was 0% in each case, so that dislocations could not be excluded. When the heating power of the heating section 15a was set to be 90% of the seed melt power (Example 34), the DF rate was 70%. When the heating power thereof was set to be 30% of the seed melt power (Example 32) or 80% thereof (Example 33), the DF rate was 100%, so that the crystals could be reliably made dislocation-free.

As described above, when the heating power of the heating section 15a was set to be less than 30% of the seed melt power, a temperature distribution required for excluding dislocations could not be formed, so that dislocations could not be excluded. And when the heating power of the heating section 15a was set to be more than 80% thereof, the crystal was melted because of overheating, so that the neck 36a could not be grown.

By setting the heating power of the heating section 15a within the range of 30 to 80% of the seed melt power, the crystals could be reliably made dislocation-free. Here, in order to make the formation speed of the neck 36a higher at the same time, it is preferable to set the heating power of the heating section 15a to be about 30% of the seed melt power.

What is claimed is:

1. An apparatus for pulling a single crystal, comprising:
   a crucible to be charged with a melt; and
   an auxiliary heating device including
   (i) a heating section to be located so as to surround a seed crystal at a position above and near the melt when in said crucible, and
   (ii) a covering section, extending from said heating section, to cover a clearance between said heating section and the seed crystal when surrounded by said heating section.

2. The apparatus according to claim 1, further comprising:
   a heater around said crucible.

3. The apparatus according to claim 2, wherein
   said auxiliary heating device further includes a transfer mechanism for withdrawing said heating section from a passing area of a single crystal.

4. The apparatus according to claim 3, wherein
   said covering section is to function as a heat insulating section or a heating section.

5. The apparatus according to claim 3, wherein
   said covering section has a first opening for allowing the seed crystal to pass therethrough when surrounded by said heating section, with a diameter of said first opening being within a range of from 1.25 to 3.0 times a diameter of the seed crystal.

6. The apparatus according to claim 3, wherein
   said heating section and said covering section each have a second opening for withdrawing from a passing area of the seed crystal when surrounded by said heating section, with a width of said second opening being within a range of from 1.25 to 3.0 times a diameter of the seed crystal.

7. The apparatus according to claim 1, wherein
   said heating section is to surround the seed crystal by defining a passageway, having an axis, through which the seed crystal is to pass, and
   said covering section extends from said heating section toward said axis.

8. The apparatus according to claim 7, wherein
   said covering section is to function as a heat insulating section or a heating section.

9. The apparatus according to claim 7, wherein
   said covering section has a first opening for allowing the seed crystal to pass therethrough when surrounded by said heating section, with a diameter of said first opening being within a range of from 1.25 to 3.0 times a diameter of the seed crystal.

10. The apparatus according to claim 7, wherein
    said heating section and said covering section each have a second opening for withdrawing from a passing area of the seed crystal when surrounded by said heating section, with a width of said second opening being within a range of from 1.25 to 3.0 times a diameter of the seed crystal.

11. The apparatus according to claim 7, wherein said covering section extends orthogonally toward said axis.

12. The apparatus according to claim 7, wherein said covering section extends obliquely toward said axis.

13. An apparatus for pulling a single crystal, comprising:
a crucible to be charged with a melt; and
an auxiliary heating device including a heating section to be located so as to surround a seed crystal at a position above and near the melt when in said crucible, said heating section having a vertically lower area and a vertically upper area, with a heating strength of said vertically lower area being greater than a heating strength of said vertically upper area.

14. The apparatus according to claim 13, further comprising:
a heater around said crucible.

15. The apparatus according to claim 14, wherein said auxiliary heating device further includes a transfer mechanism for withdrawing said heating section from a passing area of a single crystal.

16. The apparatus according to claim 15, wherein a ratio of the heating strength of said vertically upper area to the heating strength of said vertically lower area is within a range of from 1:2.0 to 1:5.0.

17. The apparatus according to claim 13, wherein said vertically upper area has a wall thickness greater than a wall thickness of said vertically lower area.

18. The apparatus according to claim 17, wherein a ratio of the heating strength of said vertically upper area to the heating strength of said vertically lower area is within a range of from 1:2.0 to 1:5.0.

19. A method for pulling a single crystal, comprising:
pulling a seed crystal from a crucible charged with a melt, through a heating section, of an auxiliary heating device, at a position above and near said melt, said heating section having a vertically lower area and a vertically upper area, with a heating strength of said vertically lower area being greater than a heating strength of said vertically upper area,
wherein a heating power of said heating section is within a range of from 30% to 80% of a heating power necessary for enabling melting of a surface of a front portion of said seed crystal when said seed crystal is dipped into said melt so as to form a neck.

20. The apparatus according to claim 19, wherein said vertically upper area has a wall thickness greater than a wall thickness of said vertically lower area.

* * * * *